(12) United States Patent
Maheshwari

(10) Patent No.: US 6,657,506 B1
(45) Date of Patent: Dec. 2, 2003

(54) LOW OPERATING VOLTAGE CRYSTAL OSCILLATOR

(75) Inventor: Sanjeev K. Maheshwari, Jaiaitaran (Pali) Rajashthan (IN)

(73) Assignee: Cypress Semiconductor Corp., San Jose, CA (US)

( * ) Notice: Subject to any disclaimer, the term of this patent is extended or adjusted under 35 U.S.C. 154(b) by 43 days.

(21) Appl. No.: 09/864,051

(22) Filed: May 23, 2001

(51) Int. Cl.[7] .............................. H03L 5/00
(52) U.S. Cl. ............... 331/109; 331/36 C; 331/158
(58) Field of Search ................ 331/109, 36 C, 331/177 V, 74, 185, 158, 57

(56) References Cited

U.S. PATENT DOCUMENTS 4,223,524 A * 9/1980 Nakagawa ............ 310/315
4,956,618 A * 9/1990 Ulmer .................. 331/108 A
5,302,920 A * 4/1994 Bitting .................... 331/45
6,181,218 B1 * 1/2001 Clark et al. ............ 331/177 R

* cited by examiner

Primary Examiner—Robert Pascal
Assistant Examiner—Kimberly E Glenn
(74) Attorney, Agent, or Firm—Christopher P. Maiorana, P.C.

(57) ABSTRACT

An apparatus comprising a first circuit and a capacitor circuit. The first circuit may be configured to generate an output signal having a frequency in response to (i) an input signal having a reference frequency and (ii) one or more adjustment signals. The capacitor circuit may be configured to adjust the frequency of the output signal. The one or more adjustment signals may provide constant current biasing of the first circuit.

20 Claims, 3 Drawing Sheets

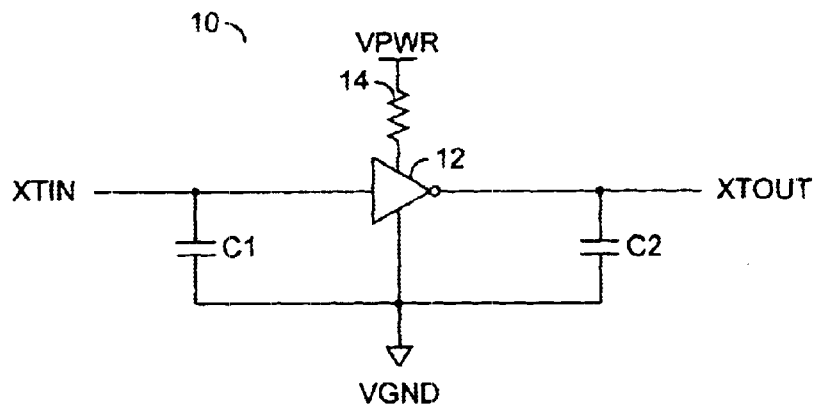
(CONVENTIONAL)
FIG. 1

LOW OPERATING VOLTAGE CRYSTAL OSCILLATOR

FIELD OF THE INVENTION

The present invention relates to a method and/or architecture for low power oscillators generally and, more particularly, to a method and/or architecture for low operating voltage crystal oscillators.

BACKGROUND OF THE INVENTION

Referring to FIG. 1, a circuit 10 is shown implementing a conventional oscillator. The circuit 10 generally comprises a circuit 12, a resistor 14, a capacitor C1, and a capacitor C2. An input signal (i.e., XTIN) is presented to the circuit 12 and to a first side of the capacitor C1. An output signal (i.e., XTOUT) is presented from the circuit 12 and to a first side of the capacitor C2. A second side of both the capacitors C1 and C2 is coupled to ground. The conventional oscillator 10 is implemented as an external oscillator configured to receive the node XTIN and present the node XTOUT.

The resistor 14 has a large resistance to reduce power consumption of the circuit 12. Additionally, a large independent external resistance (not shown) is coupled between the signal XTIN and the signal XTOUT for biasing the gain of the inverter 12. The biasing of the circuit 10 is supply dependent. Supply dependent biasing increases the parts per million (ppm) variations of the clock. The output of the circuit 10 is not easily translated to a rail to rail signal. The non-linear capacitance (C1 and C2) adds to the ppm variations. The circuit 10 has difficulties with low power supply voltages.

SUMMARY OF THE INVENTION

The present invention concerns an apparatus comprising a first circuit and a capacitor circuit. The first circuit may be configured to generate an output signal having a frequency in response to (i) an input signal having a reference frequency and (ii) one or more adjustment signals. The capacitor circuit may be configured to adjust the frequency of the output signal. The one or more adjustment signals may provide constant current biasing of the first circuit.

The objects, features and advantages of the present invention include providing a method and/or architecture for implementing low operating voltage crystal oscillators that may (i) introduce less variations in gain of the gain stage of an oscillator for a large variation in the power supply voltage (e.g., 1.8–3.6V); (ii) provide current controlled biasing in both the power and ground path; (iii) control the amplitude growth; (iv) tune the capacitance structure while introducing minimal ppm variations; (v) provide easy translation to rail-to-rail logic; and/or (vi) operate with low supply voltages.

BRIEF DESCRIPTION OF THE DRAWINGS

These and other objects, features and advantages of the present invention will be apparent from the following detailed description and the appended claims and drawings in which:

FIG. 1 is a block diagram of a conventional oscillator;

DETAILED DESCRIPTION OF THE PREFERRED EMBODIMENTS

Figure 2:
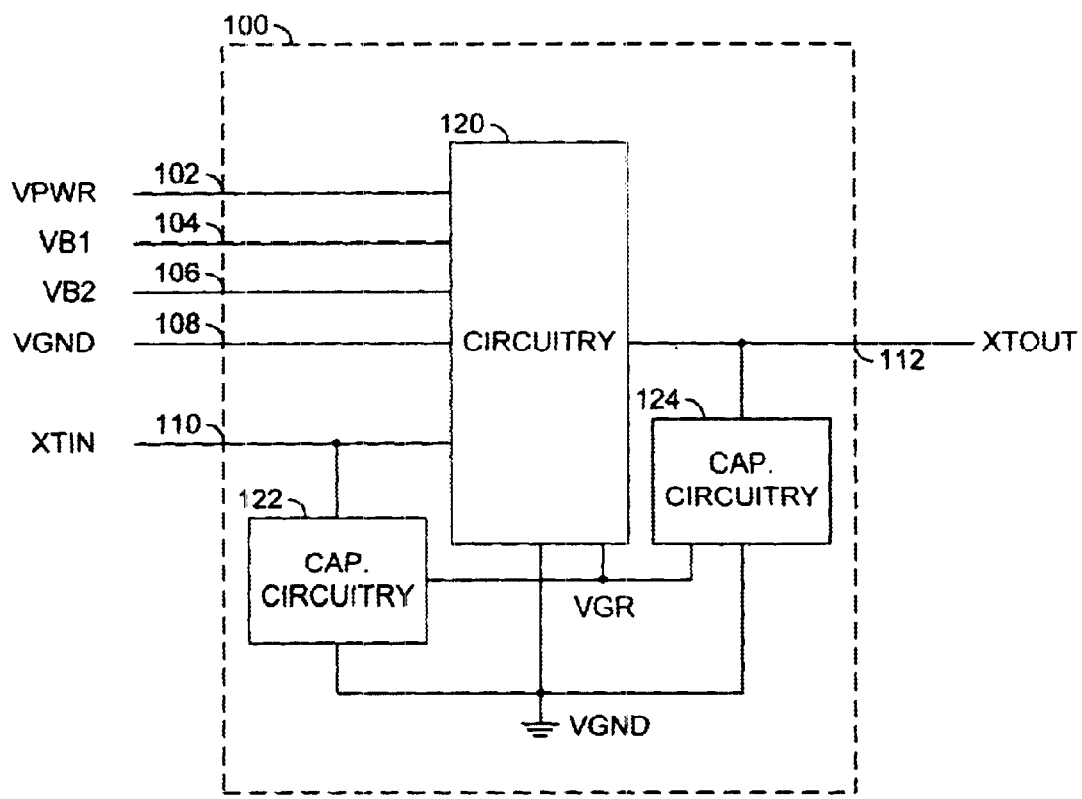
FIG. 2 is a block diagram of a preferred embodiment of the present invention.

Referring to FIG. 2, a block diagram of a circuit 100 is shown in accordance with a preferred embodiment of the present invention. The circuit 100 may be implemented, in one example, as a 32 KHz low power high accuracy crystal oscillator. The circuit 100 may be used in high precision RTC systems. In one example, the circuit 100 may have an average current consumption of less than 1 $\mu$A and a highly precise clock output (e.g., low ppm variation). The circuit 100 may operate with supply voltages ranging from 1V–5V, and preferably from 1.5V to 3.7V.

The present invention may have less variations in gain of the gain stage of an oscillator for a large variation in power supply voltage (e.g., 1.5–3.7V). Current controlled biasing in both the power and ground path may control such gain variation. The circuit 100 may generate a constant gain over a large supply voltage variation by using a constant current biasing thereby sourcing or sinking a first current and sourcing or sinking a second current proportional to the first current.

The circuit 100 may have an input 102 that may receive a signal (e.g., VPWR), an input 104 that may receive a signal (e.g., VB1), an input 106 that may receive a signal (e.g., VB2), an input 108 that may receive a signal (e.g., VGND), an input 110 that may receive a signal (e.g., XTIN) and an output 112 that may present a signal (e.g., XTOUT). The signal VPWR may be a supply voltage. The signals VB1 and VB2 may be implemented as bias signals. In one example, the signal VB1 and the signal VB2 may be implemented as constant bias voltage signals that may source or sink similar currents. The signal VGND may be a ground signal. In one example, the signal VGND may be implemented as a virtual ground signal. The signal XTIN may be a signal that oscillates at a particular frequency. The signal XTIN (e.g., a reference frequency) may be generated by an external crystal or an external crystal oscillator.

The circuit 100 generally comprises a circuit 120, a circuit 122 and a circuit 124. The circuit 122 and the circuit 124 may be implemented as capacitance circuits. The circuits 122 and 124 may be configured to provide linear capacitances, reduced ground swing, and negative feedback. The signals VPWR, VB1, VB2, VGND and XTIN may be presented to the circuit 120. The signal XTIN may also be presented to a first terminal of the circuit 122. The circuits 120, 122 and 124 may each be coupled to the ground potential VGND. The circuit 120 may have a first output that may present the signal XTOUT and a second output that may present a signal (e.g., VGR). The signal XTOUT may be presented to a first terminal of the circuit 124. The signal VGR may be presented to a second terminal of the circuit 122 and the circuit 124.

Figure 3:
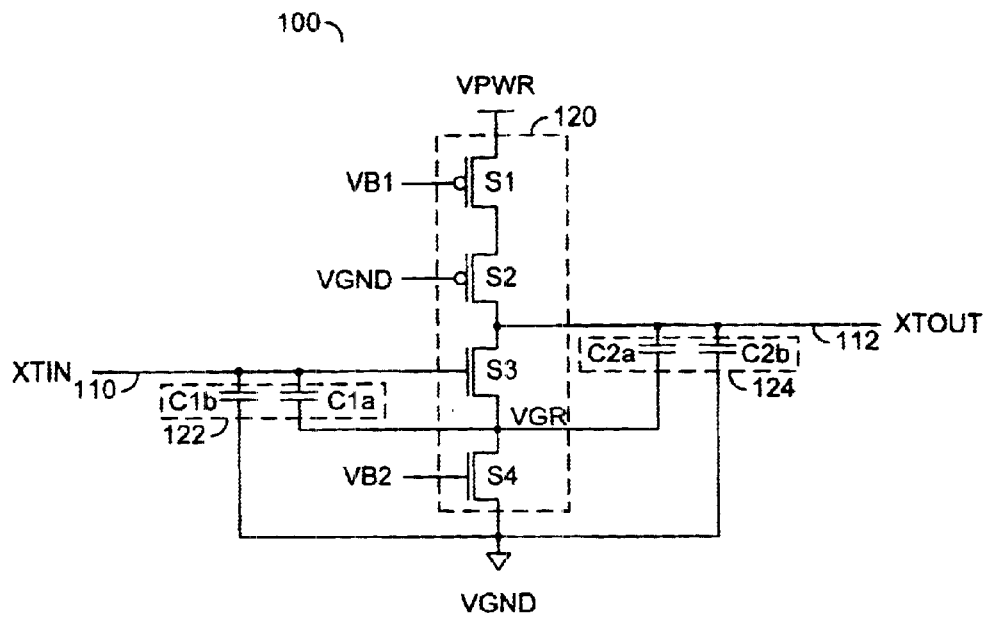
FIG. 3 is a detailed block diagram of the circuit of FIG. 2.

Referring to FIG. 3, a more detailed diagram of the circuit 100 is shown. The circuit 120 is shown comprising a transistor S1, a transistor S2, a transistor S3 and a transistor S4. The transistors S1 and S2 may be implemented as one or more PMOS transistors. The transistors S3 and S4 may be implemented as one or more NMOS transistors. However, other types and/or polarity of transistors may be implemented accordingly to meet the design criteria of a particular implementation. A gate of the transistor S1 generally receives the bias signal VB1. A gate of a transistor S2 generally receives the ground potential VGND. A gate of the transistor S3 generally receives the signal XTIN. A gate of the transistor S4 generally receives the bias signal VB2. The transistors S1–S4 may be coupled in series between VPWR and VGND. The signal VGR may be presented at a node formed by a connection of the transistor S3 to the transistor S4.

The circuit 122 generally comprises a device C1A and a device C1B. The devices C1A and C1B may be implemented, in one example, as capacitors. Alternatively, the devices C1A and C1B may be implemented as transistors configured as capacitors. The capacitor C1A is generally coupled between the input signal XTIN and the signal VGR presented at a node formed between the transistor S3 and the transistor S4. The device C1B is generally coupled between the input signal XTIN and the ground potential VGND. The circuit 124 generally comprises a device C2A and a device C2B. The devices C2A and C2B may be implemented similarly to the devices C1A and C1B. The device C2A is generally coupled between the signal XTOUT and the signal VGR presented at a node between the transistors S3 and S4. The device C2B is generally coupled between the signal XTOUT and the ground potential VGND. The circuits 122 and 124 are generally shown including two capacitance devices in each circuit. However, the particular number of capacitance devices implemented may be varied accordingly to meet the design criteria of a particular implementation.

Figure 4:
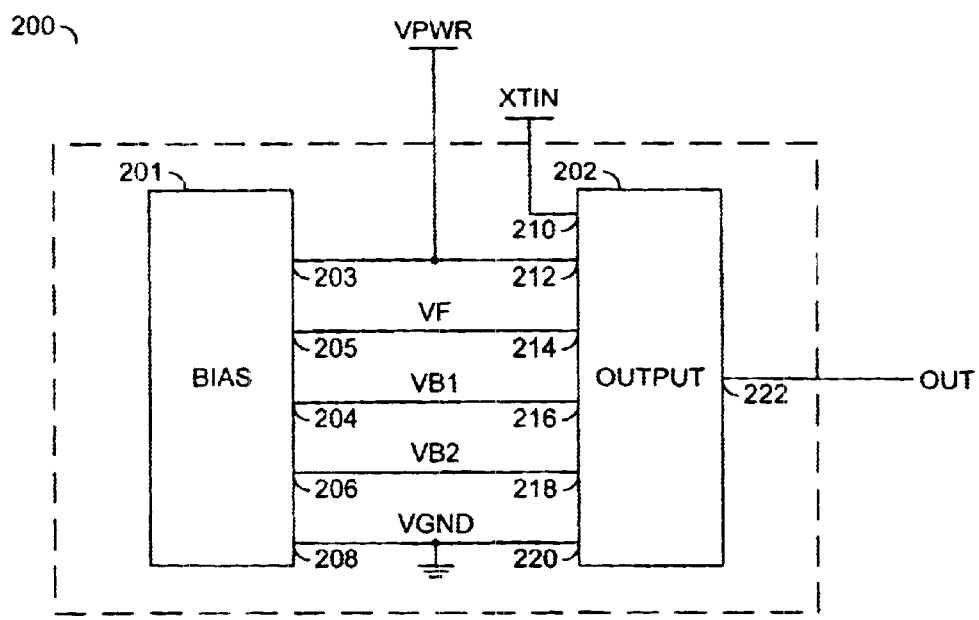
FIG. 4 is a block diagram of an implementation of the present invention in connection with an input circuit.

Referring to FIG. 4, a circuit 200 illustrating an exemplary implementation of the present invention is shown. The circuit 200 may comprise a circuit 201 and a circuit 202. The circuit 201 may be implemented as a bias circuit. The circuit 201 may have an input 203 that may receive the signal VPWR, an output 204 that may present the signal VB1, an output 205 that may present a signal (e.g., VF), an output 206 that may present the signal VB2, and a terminal 208 that may be coupled to the ground potential VGND. The circuit 201 may be configured to generate the signals VB1, VB2 and VF in response to the signals VPWR and/or VGND.

The circuit 202 may be implemented as an output circuit. The circuit 202 may have an input 210 that may receive the signal XTIN, an input 212 that may be connected to the supply voltage VPWR, an input 214 that may receive the signal VF, an input 216 that may receive the signal VB1, an input 218 that may receive the signal VB2, a terminal 220 that may be connected to the ground potential VGND, and an output 222 that may present a signal (e.g., OUT). The circuit 202 may be configured to generate the signal OUT in response to the signals VPWR, XTIN, VB1, VB2, VF and VGND.

Figure 5:
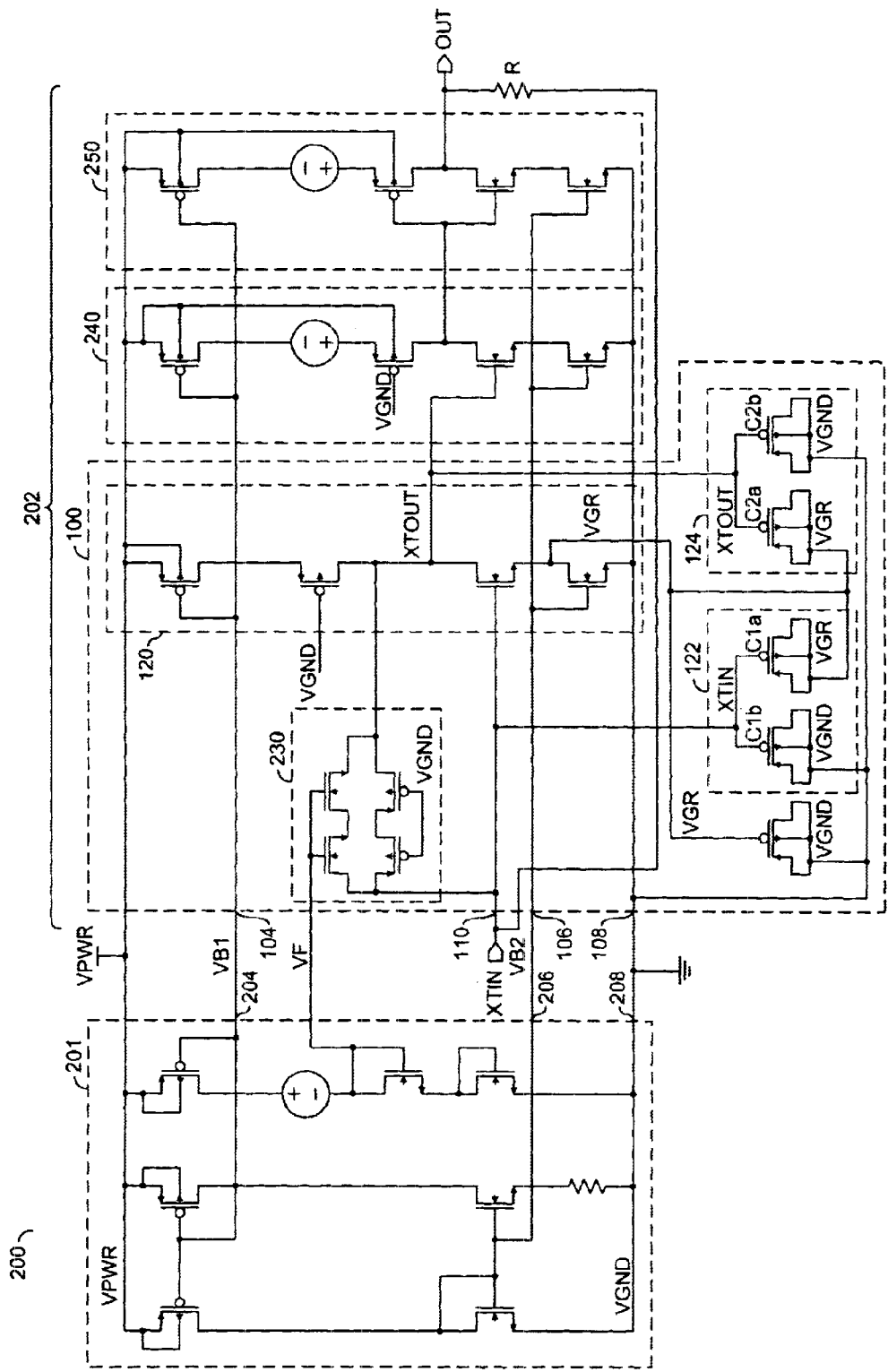
FIG. 5 is a schematic diagram illustrating an example implementation of the circuit of FIG. 4.

Referring to FIG. 5, a more detailed schematic diagram of the circuit 200 is shown. The circuit 201 may be implemented using a number of transistors configured to generate the signals VF, VB1 and VB2 in response to the signals VPWR and VGND. The circuit 202 may be implemented using the circuit 100 (described in more detail above in connection with FIG. 3), a circuit 230, a circuit 240 and a circuit 250. The circuit 230 may be implemented as a feedback circuit that may be configured to generate the biasing in response to the signals VF, XTIN and XTOUT. The circuit 240 may be configured to generate an output signal in response to the signals VPWR, VB1, XTOUT, VB2, and VGND. The circuit 250 may be configured to generate the signal OUT in response to the output of the circuit 240.

The signals VB1 and VB2 may be implemented as constant bias reference voltages configured to source/sink similar current. A large resistance (e.g., R) may be implemented between the signal XTIN and the signal XTOUT for biasing purposes. The capacitor circuits 122 and 124 may be implemented as split capacitors to provide a linear capacitance with reduced ground swing to achieve negative feedback. Constant current biasing generally avoids ppm variation due to supply voltage variations. The present invention may provide less variations in gain of the gain stage of the oscillator 100. The present invention may provide a low power structure with controlled amplitude growth. Due to the tunning capacitance structures 122 and 124, the circuit 100 may achieve less variation for tunning capacitor values in CMOS technologies. The circuit 100 may provide easy translation to rail-to-rail logic as well as the potential to operate at low supply voltages.

The present invention may have less variations in gain of the gain stage of an oscillator for a large variation in power supply voltage (e.g., 1.5–3.7V). Current controlled biasing in both the power and ground path may control such gain variation. The circuit 100 may generate a constant gain over a large supply voltage variation by using a constant current biasing thereby sourcing or sinking a first current and sourcing or sinking a second current proportional to the first current. The circuit 100 may be configured for upwards of 2.2V. The circuit 100 may provide a simple approach to control the amplitude growth.

The present invention may also include a method of generating a highly precise frequency (e.g., 32 KHz) with low power consumption, that may include (i) using current biasing to achieve constant gain over a large supply voltage variation and control the amplitude of oscillation, (ii) tuning one or more capacitor arrangements to help reduce amplitude (and thus reduce power) without the use of complicated amplitude regulation circuits, and (iii) implementing linear capacitance structure in CMOS (thus reducing the ppm variations in the output frequency). The design and architecture of the crystal oscillator gain stage, the tuning capacitance, and the buffer stage may reduce power consumption, achieve low ppm variations, and provide operation at low supply voltage.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
a first circuit configured to generate (A) an output signal having a frequency in response to (i) an input signal having a reference frequency and (ii) one or more adjustment signals and (B) a signal in response to at least one of said one or more adjustment signals; and
a capacitor circuit configured to adjust the frequency of said output signal by tuning a capacitance in response to said signal, wherein said one or more adjustment signals control a constant current biasing of said first circuit.

2. The apparatus according to claim 1, wherein a first of said one or more adjustment signals comprises a first bias voltage configured to control a first current coupled to a ground reference.

3. The apparatus according to claim 2, wherein a second of said one or more adjustment signals comprises a second bias voltage configured to control a second current coupled to a supply voltage.

4. The apparatus according to claim 1, wherein a predetermined resistance is provided between said input signal and said output signal.

5. The apparatus according to claim 1, wherein said capacitor circuit is configured to generate a negative feedback from said output signal to said input signal.

6. The apparatus according to claim 1, wherein said apparatus is further configured to reduce variations of a gain of said output signal.

7. The apparatus according to claim 1, wherein said apparatus comprises a low operating voltage crystal oscillator.

8. The apparatus according to claim 1, wherein said capacitor circuit comprises:
   a first capacitor circuit coupled between said input signal and a ground reference; and
   a second capacitor circuit coupled between said output signal and said ground reference.

9. The apparatus according to claim 8, wherein said capacitor circuit further comprises:
   a third capacitor circuit coupled between said input signal and said signal; and
   a fourth capacitor circuit coupled between said output signal and said signal.

10. The apparatus according to claim 1, wherein said capacitor circuit comprises a tunable capacitance.

11. An apparatus comprising:
   means for generating an output signal in response to an input signal and one or more adjustment signals using a constant current biasing;
   means for generating a signal in response to at least one of said one or more adjustment signals;
   means for controlling a frequency of said output signal by tuning a capacitance in response to said signal; and
   means for controlling said constant current biasing in response to said one or more adjustment signals.

12. A method for operating an oscillator, comprising the steps of:
   (A) generating an output signal in response to an input signal and one or more adjustment signals received by said oscillator using a constant current biasing;
   (B) generating a signal in response to at least one of said one or more adjustment signals;
   (C) controlling a frequency of said output signal by tuning a capacitance in response to said signal; and
   (D) controlling said constant current biasing in response to said one or more adjustment signals.

13. The method according to claim 12, wherein step (D) further comprises the sub-step of controlling a first current coupled to a ground reference in response to a first of said one or more adjustment signals.

14. The method according to claim 13, wherein step (D) further comprises the sub-step of controlling a second current coupled to a supply voltage in response to a second of said one or more adjustment signals.

15. The method according to claim 12, wherein step (A) further comprises:
   coupling a predetermined resistance between an input signal and an output signal.

16. The method according to claim 12, wherein step (A) further comprises the sub-step of generating a negative feedback from said output signal to said input signal through a capacitance.

17. The method according to claim 12, further comprising the step of reducing variations of a gain of said oscillator.

18. The method according to claim 17, wherein said oscillator comprises a low operating voltage crystal oscillator.

19. The method according to claim 12, further comprising the sub-steps of:
   first capacitively coupling said input signal to a ground reference; and
   second capacitively coupling said output signal to said ground reference.

20. The method according to claim 12, wherein at least one of said first and said second capacitively couplings is tunable.

* * * * *